United States Patent
Narayan et al.

(10) Patent No.: US 8,230,281 B2
(45) Date of Patent: Jul. 24, 2012

(54) TECHNIQUES FOR BOUNDARY SCAN TESTING USING TRANSMITTERS AND RECEIVERS

(75) Inventors: Sriram Narayan, Pleasanton, CA (US); Xiaoyan Su, San Jose, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 391 days.

(21) Appl. No.: 12/422,916

(22) Filed: Apr. 13, 2009

(65) Prior Publication Data

US 2010/0262877 A1    Oct. 14, 2010

(51) Int. Cl.
*G01R 31/3177* (2006.01)
*G01R 31/40* (2006.01)

(52) U.S. Cl. ............ 714/727; 714/733; 327/54
(58) Field of Classification Search ............ None
See application file for complete search history.

(56) References Cited

U.S. PATENT DOCUMENTS

| | | | |
|---|---|---|---|
| 5,036,215 A * | 7/1991 | Masleid et al. ......... 327/410 |
| 5,802,073 A | 9/1998 | Platt |
| 5,955,890 A * | 9/1999 | Gillette ......... 326/30 |
| 5,963,104 A * | 10/1999 | Buer ......... 331/78 |
| 6,085,345 A * | 7/2000 | Taylor ......... 714/731 |
| 6,298,458 B1 * | 10/2001 | Cranford et al. ......... 714/716 |
| 6,462,852 B1 * | 10/2002 | Paschal et al. ......... 398/202 |
| 6,763,486 B2 * | 7/2004 | Lai et al. ......... 714/727 |
| 6,816,987 B1 | 11/2004 | Olson et al. |
| 7,200,170 B1 | 4/2007 | Desandoli et al. |
| 7,355,432 B2 * | 4/2008 | Matsumoto ......... 324/762.02 |
| 7,487,412 B2 | 2/2009 | Baeg et al. |
| 2002/0079926 A1 * | 6/2002 | Haycock et al. ......... 326/83 |
| 2005/0192772 A1 * | 9/2005 | Pepper ......... 702/122 |
| 2008/0030217 A1 * | 2/2008 | Patel et al. ......... 324/765 |

OTHER PUBLICATIONS

"IEEE Standard for Boundary-Scan Testing of Advanced Digital Networks," IEEE Computer Society, IEEE Std 1149.6 2003, Apr. 17, 2003, pp. 1-132.

* cited by examiner

*Primary Examiner* — Jeffrey A Gaffin
*Assistant Examiner* — Dipakkumar Gandhi
(74) *Attorney, Agent, or Firm* — Steven J. Cahill

(57) ABSTRACT

A test driver transmitter drives a test signal through a resistive termination circuit to a first pin to test components on a board during a boundary scan test operation. A test receiver receives the test signal through a second pin and a pass gate coupled to the second pin during the boundary scan test operation. A test signal is transmitted to the test receiver during loopback operation through a loopback circuit.

24 Claims, 6 Drawing Sheets

TECHNIQUES FOR BOUNDARY SCAN TESTING USING TRANSMITTERS AND RECEIVERS

BACKGROUND

The present invention relates to electronic circuits, and more particularly, to techniques for boundary scan testing using transmitter circuits and receiver circuits.

The IEEE Standard for Boundary-Scan Testing of Advanced Digital Networks 1149.6 is a standard that provides design guidance for testability circuitry added to an integrated circuit (IC) in addition to the testability provisions specified by the IEEE Standard 1149.1.

BRIEF SUMMARY

According to some embodiments, a test driver transmitter circuit drives a test signal through a resistive termination circuit to a first pin to test components on a board during a boundary scan test operation. A test receiver receives the test signal through a second pin and a pass gate coupled to the second pin during the boundary scan test operation. According to another embodiment, a test signal is transmitted to the test receiver during loopback operation through a loopback circuit.

Various objects, features, and advantages of the present invention will become apparent upon consideration of the following detailed description and the accompanying drawings.

DETAILED DESCRIPTION

In large systems having many integrated circuits (ICs) with thousands of pins on a board and complex system interactions, it has become extremely difficult to debug system failures. Faults or defects on one of the integrated circuits in the system or on the board may cause a failure. The faults and defects on the board include solder overflow, shorts among pins, shorts to the supply voltage VDD or to ground, electrostatic discharge (ESD) failures, and other failures during assembly.

An in-system test is beneficial for quickly locating failures on a board. The AC JTAG 1149.6 specification discusses boundary-scan testing of boards where signal pathways make use of differential signaling and/or AC-coupled technologies. AC refers to alternating current, and JTAG refers to Joint Test Action Group. However, the adoption rate for the JTAG 1149.6 standard has been slow because of the additional burden placed on the integrated circuit (IC) designer where low-speed testing and high-speed pins co-exist on the same IC.

Figure 1A:
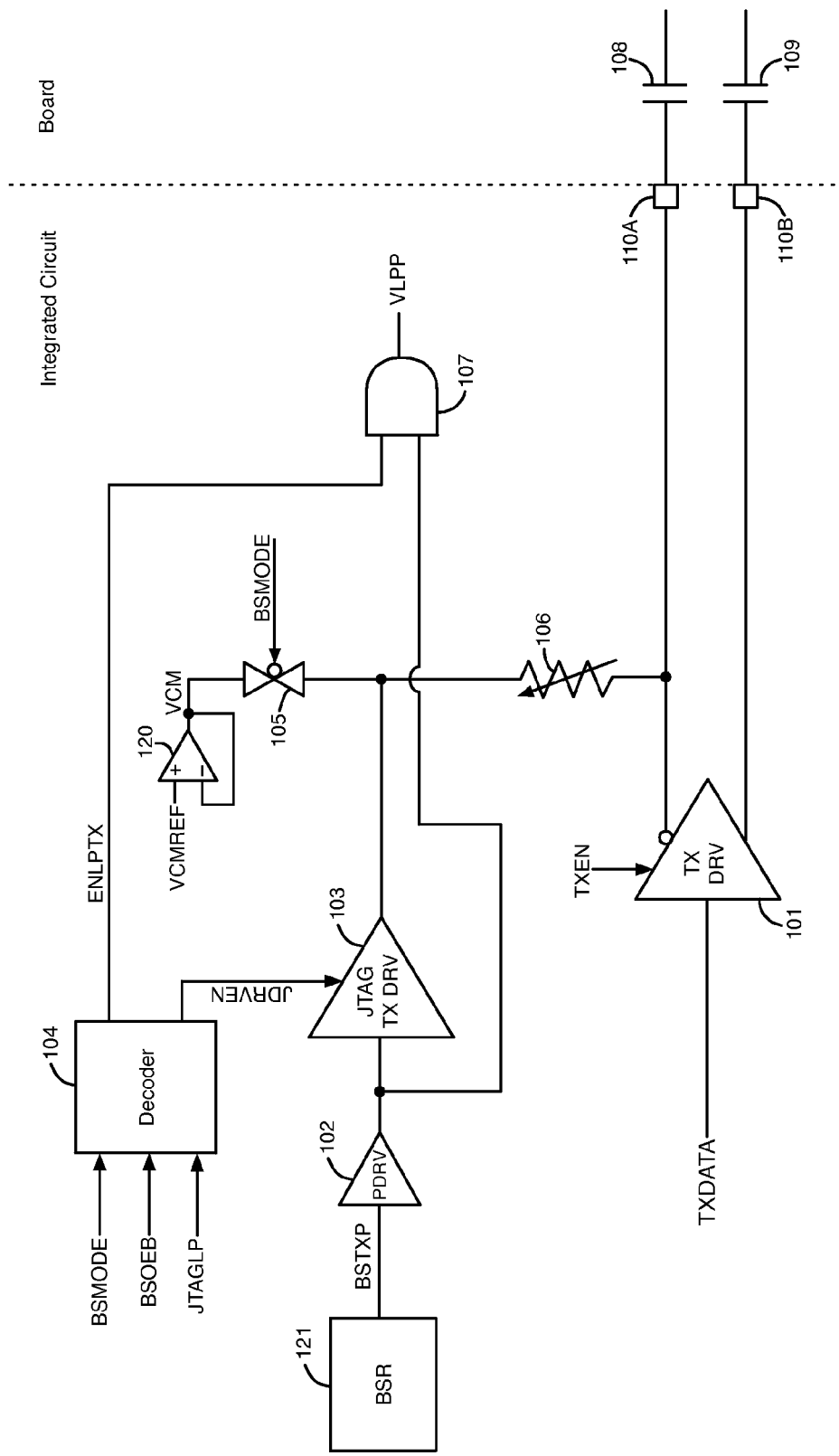
FIGS. 1A-1B illustrate an example of JTAG transmitter circuitry that is used for transmitting test signals, according to embodiments of the present invention.
Figure 1B:
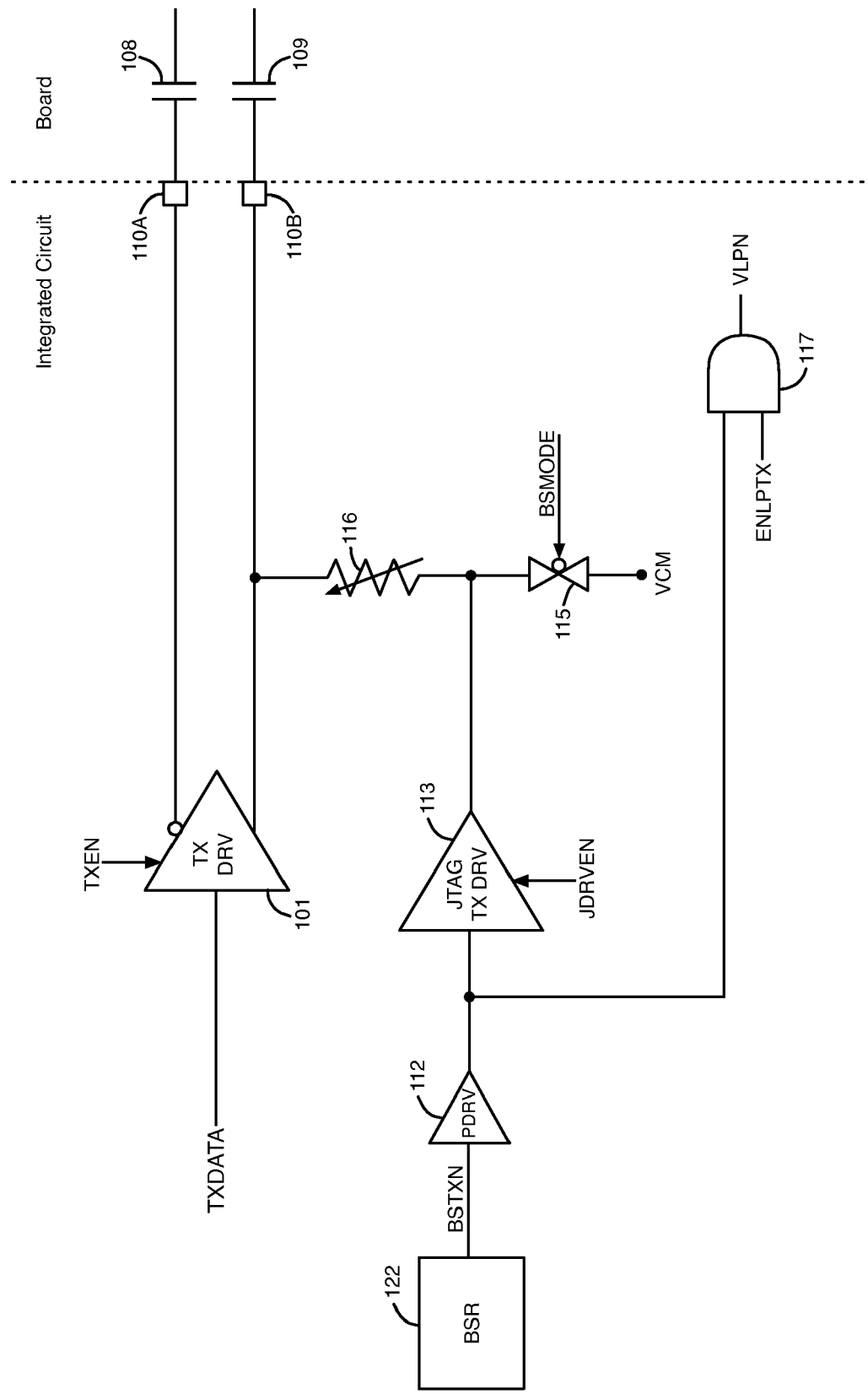

FIGS. 1A-1B illustrate an example of JTAG transmitter circuitry that is used for transmitting test signals. The implementation for the JTAG transmitter circuitry shown in FIGS. 1A-1B achieves full defect testing with a minimal impact on the performance of the transmitter during data transmission operation (e.g., during mission mode).

The circuitry shown in FIGS. 1A-1B that is fabricated on one integrated circuit includes a transmitter driver circuit 101, pre-driver circuits 102 and 112, JTAG transmitter driver circuits 103 and 113, a decoder circuit block 104, pass gates 105 and 115, resistors 106 and 116, AND gates 107 and 117, a buffer circuit 120, boundary scan registers (BSRs) 121 and 122, and output pins 110A-110B. Driver 101 and output pins 110A-110B shown in FIG. 1A are the same driver 101 and output pins 110A-110B shown in FIG. 1B on the same integrated circuit. The circuitry shown in FIGS. 1A-1B can be fabricated on any type of integrated circuit, such as a field programmable gate array (FPGA) or an application-specific integrated circuit (ASIC).

During data transmission operation, output pins 110A-110B may be coupled to input pins on the same integrated circuit or to input pins on another integrated circuit through connections on a board. AC JTAG operation refers to a boundary scan test mode during which the JTAG transmitter circuitry of FIGS. 1A-1B transmits test signals through AC-coupled components on a board. During AC JTAG operation, output pins 110A-110B are coupled to input pins in a receiver circuit. In the examples shown in FIGS. 1A-1B, output pins 110A-110B are AC-coupled to the input pins through capacitors 108-109, respectively. Capacitors 108-109 are located on a board.

Transmitter driver circuit 101 receives a single-ended data signal TXDATA. During data transmission operation, transmitter driver circuit 101 converts the single-ended data signal TXDATA into an analog differential data signal, and then drives the analog differential data signal to pins 110A-110B.

A control signal BSMODE is transmitted to an input terminal of pass gate 105 and to an input terminal of pass gate 115. The logic state of control signal BSMODE determines the conductive states of pass gates 105 and 115. Thus, the logic state of control signal BSMODE determines whether pass gates 105 and 115 are closed (i.e., conductive to allow current flow) or opened (i.e., non-conductive to block current flow). Pass gates 105, 115, and the other pass gates described herein can include one, two, or more transistors coupled together in parallel. Switches can also implement the pass gates described herein. Pass gates are also referred to as transmission gates.

A control signal TXEN is transmitted to an enable input terminal of transmitter driver circuit 101. The logic state of TXEN determines whether transmitter driver circuit 101 is powered on or off. When transmitter driver circuit 101 is powered on, transmitter driver circuit 101 drives the TXDATA voltage data signal to pins 110A-110B as a differential output voltage signal. When transmitter driver circuit 101 is powered off, transmitter driver circuit 101 is in a high impedance state and does not drive the TXDATA data signal to pins 110A-110B as a differential output voltage signal.

A control signal JDRVEN is transmitted from decoder 104 to an enable input terminal of JTAG driver circuit 103 and to an enable input terminal of JTAG driver circuit 113. Decoder 104 generates the JDRVEN signal in response to input control signal BSMODE. The logic state of signal JDRVEN determines whether JTAG driver circuits 103 and 113 are powered on or powered off. When JTAG driver circuits 103 and 113 are powered on, JTAG driver circuits 103 and 113 drive the output signals of pre-driver circuits 102 and 112 to resistors 106 and 116, respectively. When JTAG driver circuits 103 and 113 are powered off, JTAG driver circuits 103 and 113 are in high impedance states and do not drive signals from pre-driver circuits 102 and 112 to resistors 106 and 116, respectively.

The BSMODE control signal determines whether the circuitry of FIGS. 1A-1B functions in data transmission operation or in AC JTAG operation. During the data transmission operation of transmitter driver circuit 101, control signal BSMODE is in a logic state that closes pass gates 105 and 115. As a result, pass gate 105 couples resistor 106 to a common mode voltage VCM, and pass gate 115 couples resistor 116 to the common mode voltage VCM.

Buffer circuit 120 drives the common mode voltage signal VCM received at pass gates 105 and 115 to a constant stable voltage that is based on a common mode reference voltage VCMREF. Buffer 120 can be, for example, a unity gain buffer that causes VCM to be equal to VCMREF. VCM can be driven to any suitable voltage (e.g., 0.6-0.7 volts).

Also during the data transmission operation of transmitter driver circuit 101, control signal TXEN powers on transmitter driver circuit 101, and control signal JDRVEN powers off JTAG driver circuits 103 and 113 so that they are in high-impedance states. In data transmission operation, transmitter driver circuit 101 transmits an analog serial differential voltage data signal to pins 110A-110B in response to input data signal TXDATA. Transmitter driver circuit 101 can drive differential data signals that have high frequencies (e.g., 1-10 GHz) to pins 110A-110B.

Termination resistors 106 and 116 have adjustable resistance values. A network of resistors and/or transistors can implement each of resistors 106 and 116. For example, each resistor 106 and 116 can include resistors coupled to pass gates. The resistances of termination resistors 106 and 116 can be adjusted to match the characteristic impedance of the transmission lines coupled to pins 110A-110B, respectively, to reduce or eliminate signal reflection. The resistances of termination resistors 106 and 116 can be adjusted by changing the conductive states of the pass gates in resistors 106 and 116 to couple the resistors in different configurations to provide different net resistance values. For example, the resistance of each of resistors 106 and 116 can be adjusted to be equal to 50 ohms.

During AC JTAG operation, the BSMODE control signal is in a logic state that opens pass gates 105 and 115. During AC JTAG operation, pass gate 105 remains opened, and pass gate 115 remains opened. When pass gate 105 is open, resistor 106 is decoupled from common mode voltage VCM. When pass gate 115 is open, resistor 116 is decoupled from common mode voltage VCM.

Also during AC JTAG operation, the TXEN control signal is in a logic state that causes transmitter driver circuit 101 to be powered off in a high impedance state. Although, transmitter driver circuit 101 can remain powered on during the AC JTAG operation.

In AC JTAG operation, JTAG transmitter driver circuits 103 and 113 drive digital boundary scan test voltage signals BSTXP and BSTXN to pins 110A and 110B, respectively. Digital test signals BSTXP and BSTXN are generated to test the integrity and operability of off-chip components on the board that are AC-coupled in the path of signals driven from output pins 110A-110B to other circuitry. Test signals BSTXP and BSTXN can, for example, be transmitted from boundary scan registers 121 and 122 to pre-diver circuits 102 and 112, respectively.

Pre-driver circuit 102 drives boundary scan test signal BSTXP to an input of JTAG transmitter driver circuit 103. JTAG transmitter driver circuit 103 then drives the BSTXP boundary scan test signal to output pin 110A through resistor 106. Pre-driver circuit 112 drives boundary scan test signal BSTXN to an input of JTAG transmitter driver circuit 113. JTAG transmitter driver circuit 113 then drives the BSTXN boundary scan test signal to output pin 110B through resistor 116. JTAG transmitter driver circuits 103 and 113 typically drive low frequency test signals BSTXP and BSTXN to pins 110A-110B, respectively.

Figure 2A:
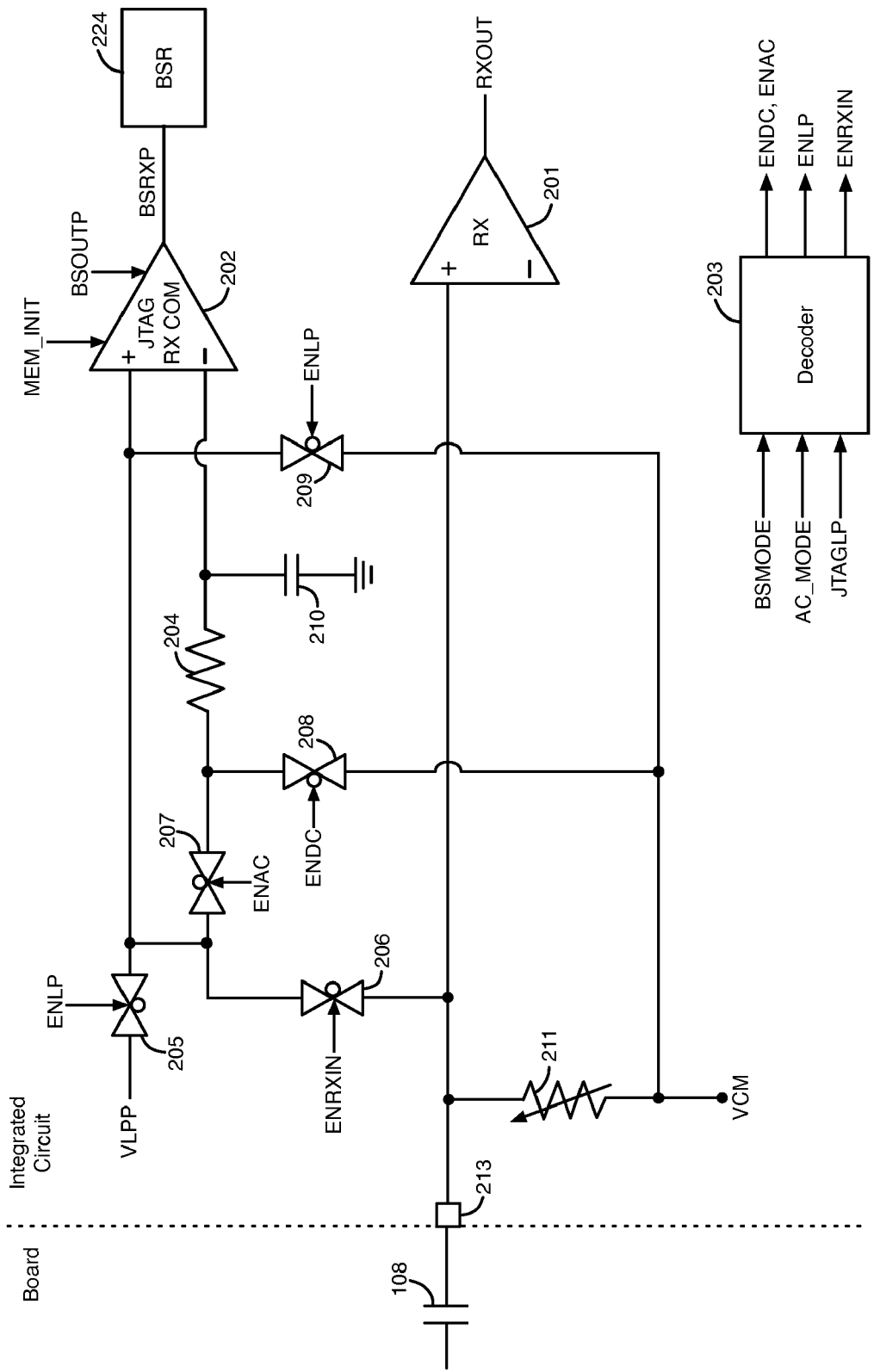
FIGS. 2A-2B illustrate an example of JTAG receiver circuitry that is used for receiving test signals, according to embodiments of the present invention.
Figure 2B:
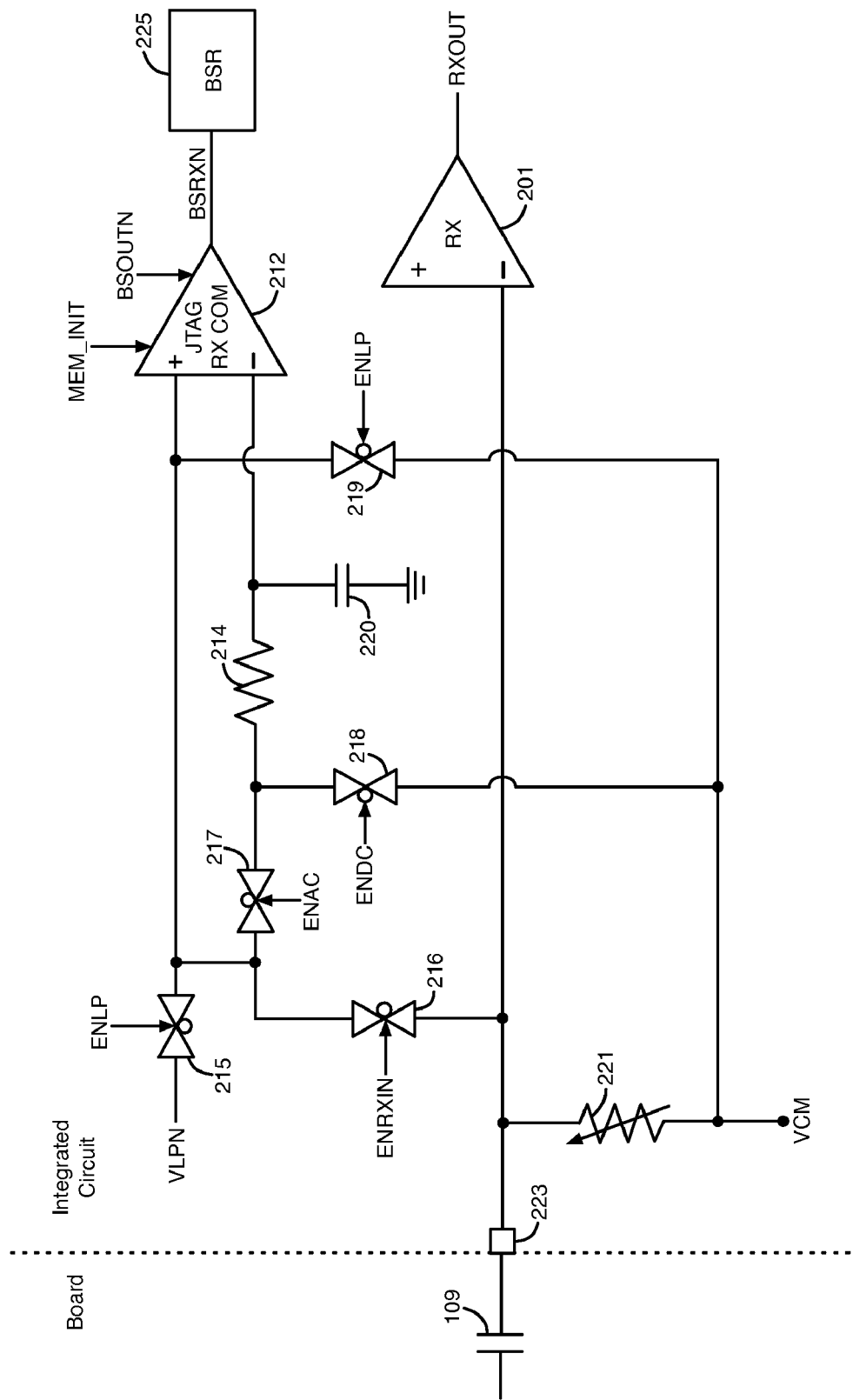

The BSTXP and BSTXN test signals are transmitted from pins 110A-110B through transmission lines and AC-coupled capacitors 108-109 to JTAG receivers shown in FIGS. 2A-2B, respectively. FIGS. 2A-2B are described in further detail below. The JTAG receivers are located in the same channel on the same integrated circuit as JTAG transmitter driver circuits 103 and 113. The JTAG receivers typically have termination resistors that also match the characteristic impedance of the transmission lines (e.g., 50 ohms).

The input voltage swing of the BSTXP and BSTXN signals at the JTAG receivers is typically one-half of the voltage swing of the BSTXP and BSTXN signals at the output terminals of JTAG transmitter driver circuits 103 and 113. The test signals received by the JTAG receivers are 50% of the supply voltage VDD (e.g., 0.5 volts for 1 volt VDD). The reduction in the voltage swing of the test signals does not cause a problem, because JTAG transmitter driver circuits 103 and 113 drive the BSTXP and BSTXN test signals from rail-to-rail (i.e., between the supply voltage VDD and the ground voltage). The JTAG receivers have sufficient sensitivity in the presence of noise to sense input test signals that are 50% of the supply voltage VDD. JTAG transmitter driver circuits 103 and 113 can include, for example, digital CMOS inverters coupled together in series as buffer circuits that drive the BSTXP and BSTXN test signals from rail-to-rail. Digital CMOS inverter buffers are advantageous, because they take up a small amount of die area on the integrated circuit die.

In the test circuitry of FIGS. 1A-1B, JTAG transmitter drivers 103 and 113 drive test signals through resistors 106 and 116 to pins 110A-110B, respectively. Resistor 106 isolates the output capacitance of JTAG transmitter driver circuit 103 from pin 110A, and resistor 116 isolates the output capacitance of JTAG transmitter driver circuit 113 from pin 110B. The output capacitances of JTAG transmitter driver circuits 103 and 113 do not load the highly parasitic sensitive pins 110A-110B, respectively, during data transmission operation when JTAG driver circuits 103 and 113 are disabled and transmitter driver circuit 101 is driving a high frequency analog differential data signal to pins 110A-110B. As a result, the output capacitances of JTAG driver circuits 103 and 113 have a minimal impact on the operation and the AC performance of transmitter driver circuit 101 during data transmission operation. The output capacitances at pins 110A-110B remain low enough to allow transmitter driver circuit 101 to drive high frequency signals (e.g., 1-10 GHz) to pins 110A-110B.

Because the test circuitry of FIGS. 1A-1B has two JTAG transmitter driver circuits 103 and 113, and the common mode voltage VCM is disconnected from the output terminals of driver circuits 103 and 113 during the AC JTAG operation, board-level tests can be performed using test patterns for signals BSTXP and BSTXN that are independently driven to pins 110A-110B. Also, the test patterns for BSTXP and BSTXN that are driven to driver circuits 103 and 113 can be generated independently. The test patterns do not need to be complementary signals. For example, signals BSTXP and BSTXN can be generated and driven as 1 and 1, 1 and 0, 0 and 1, or 0 and 0, respectively, at the same time, as shown in Table 1 below.

TABLE 1

|        | BSTXP | BSTXN |
|--------|-------|-------|
| Test 1 | 1     | 1     |
| Test 2 | 1     | 0     |
| Test 3 | 0     | 1     |
| Test 4 | 0     | 0     |

1 represents a logic high signal, and 0 represents a logic low signal. When signals BSTXP and BSTXN are 1 and 1 at the same time or 0 and 0 at the same time, the signals are not complementary. Driving independently generated test patterns from driver circuits 103 and 113 to pins 110A-110B, respectively, permits a larger number of potential faults to be tested and permits an easier identification of certain types of faults.

The test circuitry of FIGS. 1A-1B also includes a loopback circuit. The loopback circuit includes pre-drivers 102 and 112 and logic AND gates 107 and 117. Decoder 104 generates a loopback enable signal ENLPTX in response to input control signals BSMODE and JTAGLP. Loopback enable signal ENLPTX is transmitted to a first input terminal of both of AND gates 107 and 117. Pre-driver circuit 102 drives the boundary scan test signal BSTXP to the second input terminal of AND gate 107. Pre-driver circuit 112 drives the boundary scan test signal BSTXN to the second input terminal of AND gate 117.

When the ENLPTX signal is in a logic low state, the ENLPTX signal blocks AND gate 107 from transmitting boundary scan test signal BSTXP to the JTAG receiver circuitry shown in FIG. 2A, and the ENLPTX signal blocks AND gate 117 from transmitting the boundary scan test signal BSTXN to the JTAG receiver circuitry shown in FIG. 2B.

During loopback operation, decoder 104 drives the ENLPTX signal to a logic high state. When the ENLPTX signal is in a logic high state, AND 107 transmits boundary scan test signal BSTXP to the JTAG receiver circuitry in FIG. 2A as a first loopback signal VLPP, and AND gate 117 transmits boundary scan test signal BSTXN to the JTAG receiver circuitry in FIG. 2B as a second loopback signal VLPN.

During loopback operation, signals VLPP and VLPN are transmitted to the JTAG receiver circuitry in FIGS. 2A-2B that is fabricated on the same integrated circuit as the JTAG transmitter circuitry shown in FIGS. 1A-1B. The loopback signals VLPP and VLPN are transmitted to the JTAG receiver circuitry through routing conductors and circuits fabricated on the same integrated circuit that contains the JTAG transmitter and receiver circuitry. The loopback signals VLPP and VLPN are not transmitted off-chip outside the integrated circuit. The loopback signals VLPP and VLPN are used to test the integrity and operability of the on-chip components in the JTAG transmitter circuitry shown in FIGS. 1A-1B, the JTAG receiver circuitry shown in FIGS. 2A-2B, and any other circuitry in the loopback path on the integrated circuit.

The capacitances at the output terminals of pre-driver circuits 102 and 112 are much smaller than the capacitances at the output terminals of JTAG transmitter driver circuits 103 and 113. The boundary scan test signals BSTXP and BSTXN are driven from the output terminals of pre-driver circuits 102 and 112 to AND gates 107 and 117 rather than from the output terminals of driver circuits 103 and 113, respectively, to reduce the capacitances at AND gates 107 and 117 that load the loopback signals VLPP and VLPN during loopback operation.

The test circuitry shown in FIGS. 1A-1B can be added to a transmitter design without modifying the main transmitter driver circuit 101. Thus, the test circuitry of FIGS. 1A-1B requires no changes to the design of transmitter driver circuit 101.

FIGS. 2A-2B illustrate an example of JTAG receiver circuitry that is used for receiving test signals. The implementation for the JTAG receiver circuitry shown in FIGS. 2A-2B achieves full defect testing for AC-coupled and DC-coupled input signals during JTAG operation. The JTAG receiver circuitry shown in FIGS. 2A-2B has a minimal impact on the performance of the receiver during data transmission operation (e.g., during mission mode).

The circuitry shown in FIGS. 2A-2B that is fabricated on one integrated circuit includes receiver circuit 201, JTAG hysteretic comparator circuits 202 and 212, decoder 203, resistors 204 and 214, pass gates 205-209 and 215-219, capacitors 210 and 220, variable termination resistors 211 and 221, input pins 213 and 223, and boundary scan registers (BSRs) 224 and 225. The receiver circuit 201 in FIG. 2A is the same receiver circuit 201 in FIG. 2B. Receiver circuit 201 can include, for example, an amplifier or a comparator circuit.

The circuitry shown in FIGS. 2A-2B can be fabricated on any type of integrated circuit, such as a field programmable gate array (FPGA) or an application-specific integrated circuit (ASIC). The circuitry of FIGS. 2A-2B can be fabricated in the same channel on the same integrated circuit as the circuitry shown in FIGS. 1A-1B.

In JTAG operation, input pins 213 and 223 are coupled to output pins in the same channel on the same integrated circuit through external components. Input pins 213 and 223 are coupled to output pins 110A and 110B, respectively, through external components during JTAG operation. For example, input pins 213 and 223 can be AC-coupled to output pins 110A and 110B through capacitors 108-109, respectively. During data transmission operation, input pins 213 and 223 are coupled to output pins in a different channel, typically on a different integrated circuit (e.g., through AC-coupled external components).

A control signal ENLP from decoder 203 controls the conductive states of pass gates 205, 215, 209, and 219. A control signal ENRXIN from decoder 203 controls the conductive states of pass gates 206 and 216. A control signal ENAC from decoder 203 controls the conductive states of pass gates 207 and 217. A control signal ENDC from decoder 203 controls the conductive states of pass gates 208 and 218. Decoder 203 generates the ENLP signal in response to the JTAGLP control signal. Decoder 203 generates the ENRXIN signal in response to the BSMODE control signal. Decoder 203 generates the ENDC and ENAC signals in response to the AC_MODE control signal.

During data transmission operation, receiver circuit 201 receives the analog differential data signal driven by transmitter driver circuit 101 through external components to pins 213 and 223. Receiver circuit 201 senses the differential voltage across its non-inverting and inverting input terminals to generate a data output signal RXOUT. Receiver circuit 201 drives data signal RXOUT to other circuitry on the integrated circuit.

During the data transmission operation of receiver circuit 201, the BSMODE signal is de-asserted, causing the ENRXIN control signal to be in a logic state that maintains switches 206 and 216 in opened non-conductive states. When switches 206 and 216 are opened, JTAG comparators 202 and 212 are disconnected completely from input pins 213 and 223, respectively, to minimize any capacitive loading on input pins 213 and 223. Input pins 213 and 223 are very high-speed pins. Input pins 213 and 223 are also highly parasitic sensitive pins. Disconnecting JTAG comparator circuits 202 and 212 from pins 213 and 223 allows high frequency data signals (e.g., 1-10 GHz) to be transmitted through pins 213 and 223 to receiver circuit 201 during data transmission operation. Return loss for the high-speed serial input signals received at pins 213 and 223 is minimally impacted. The addition of JTAG hysteretic comparators 202 and 212 does not require modifications to the multi-gigahertz receiver circuit 201.

The JTAG receiver circuitry of FIGS. 2A-2B can isolate common mode faults in external components by detecting signals that are transmitted from external links during JTAG operation. The JTAG receiver circuitry of FIGS. 2A-2B includes JTAG hysteretic comparator circuits 202 and 212, resistors 204 and 214, pass gates 205-209 and 215-219, capacitors 210 and 220, and decoder 203.

The BSMODE signal is asserted during JTAG operation. When the BSMODE signal is asserted, the ENRXIN signal is in a logic state that closes switches 206 and 216. When switches 206 and 216 are closed, JTAG hysteretic comparator circuits 202 and 212 are coupled to pins 213 and 223 through switches 206 and 216, respectively.

JTAG hysteretic comparator circuit 202 is enabled by the MEM_INIT and BSOUTP signals during JTAG operation. JTAG hysteretic comparator circuit 212 is enabled by the MEM_INIT and BSOUTN signals during JTAG operation.

During JTAG operation, JTAG hysteretic comparator circuits 202 and 212 test the signals received at pins 213 and 223, respectively, for errors. JTAG operation includes AC JTAG operation and DC JTAG operation. During AC JTAG operation, JTAG hysteretic comparator circuits 202 and 212 sense and detect errors in input test signals that are received at pins 213 and 223, respectively, after being transmitted through AC-coupled external components. During DC JTAG operation, JTAG hysteretic comparator circuits 202 and 212 sense and detect errors in input test signals received at pins 213 and 223, respectively, after being transmitted through DC-coupled external components. DC stands for direct current.

The ENAC and ENDC control signals determine whether the test circuitry of FIGS. 2A-2B is coupled in a configuration that provides for the detection of errors in AC-coupled input signals or in DC-coupled input signals. During the AC JTAG operation, the ENAC signal is in a logic state that causes pass gates 207 and 217 to be in conductive closed states, and the ENDC signal is in a logic state that causes pass gates 208 and 218 to be in non-conductive opened states.

During AC JTAG operation, the non-inverting (+) input terminal of JTAG hysteretic comparator 202 is coupled to receive the input signal at pin 213 through pass gate 206, and the inverting (−) input terminal of JTAG hysteretic comparator 202 is coupled to receive the input signal at pin 213 through pass gates 206-207 and resistor 204. Also, during AC JTAG operation, the non-inverting input terminal of JTAG hysteretic comparator 212 is coupled to receive the input signal at pin 223 through pass gate 216, and the inverting input terminal of JTAG hysteretic comparator 212 is coupled to receive the input signal at pin 223 through pass gates 216-217 and resistor 214.

Each of the JTAG hysteretic comparators 202 and 212 can include two internal comparator circuits. One internal comparator circuit is coupled to compare the signal at the non-inverting input terminal of the hysteretic comparator to a first reference signal, and the other internal comparator circuit is coupled to compare the signal at the inverting input terminal of the hysteretic comparator to a second reference signal. The internal comparator circuits set or reset a flip-flop in the hysteretic comparator. A pulse in the differential signal across the input terminals of the hysteretic comparator 202/212 produces a set or reset pulse into the flip-flop, depending on whether the pulse is increasing or decreasing. The output signal of the flip-flop is the output signal of the hysteretic comparator circuit 202/212, which is shown as BSRXP/BSRXN, respectively, in FIGS. 2A-2B. Output signals BSRXP and BSRXN can, for example, be transmitted from comparators 202 and 212 to boundary scan registers 224 and 225, respectively.

During AC JTAG operation, resistor 204 and capacitor 210 are coupled to form a first low pass filter at the inverting input terminal of JTAG hysteretic comparator circuit 202. Also, during AC JTAG operation, resistor 214 and capacitor 220 are coupled to form a second low pass filter at the inverting input terminal of JTAG hysteretic comparator circuit 212.

When voltage transitions occur on input pins 213 and 223 during AC JTAG operation, the voltage transitions appear almost immediately at the non-inverting input terminals of JTAG hysteretic comparator circuits 202 and 212, respectively. The low pass filter formed by resistor 204 and capacitor 210 delays the voltage transition at the inverting input terminal of circuit 202 relative to the voltage transition at the non-inverting input terminal of circuit 202. Similarly, the low pass filter formed by resistor 214 and capacitor 220 delays the voltage transition at the inverting input terminal of circuit 212 relative to the voltage transition at the non-inverting input terminal of circuit 212.

The delays in the voltage transitions generated by the low pass filters allow JTAG hysteretic comparator circuits 202 and 212 to detect voltage transitions during the AC JTAG mode. The delays in the voltage transitions generated by the low pass filters cause small differential voltages across the input terminals of JTAG hysteretic comparators 202 and 212. If the differential voltages across the input terminals of comparators 202 and 212 have sufficiently fast rise or fall times and sufficient amplitudes to overcome the hysteresis of the comparators, the output signals BSRXP and BSRXN change state. This process is referred to as edge detection.

For example, after logic low-to-high voltage transitions at pins 213 and 223, the voltages at the non-inverting input terminals of JTAG hysteretic comparator circuits 202 and 212 increase faster than the voltages at their inverting input terminals, respectively. In response to the faster increasing voltages at their non-inverting input terminals, each JTAG hysteretic comparator circuit 202/212 generates a logic high pulse in its respective output signal BSRXP/BSRXN if the differential input voltage rises above an upper trip point.

The hysteresis of comparators 202 and 212 reduces the sensitivity of the output signals BSRXP and BSRXN to noise received at the input terminals of the comparators. Because comparators 202 and 212 have hysteresis and a wide input common-mode range, a wide set of defects can be identified in the presence of noise.

During DC JTAG operation, the ENAC signal is in a logic state that causes pass gates 207 and 217 to be in non-conductive opened states, and the ENDC signal is in a logic state that causes pass gates 208 and 218 to be in conductive closed states. During DC JTAG operation, the non-inverting input terminal of JTAG hysteretic comparator 202 is coupled to receive the input test signal at pin 213 through pass gate 206, and the inverting input terminal of JTAG hysteretic comparator 202 is coupled to receive the constant common mode reference voltage VCM through pass gate 208 and resistor 204. Also, during DC JTAG operation, the non-inverting input terminal of JTAG hysteretic comparator 212 is coupled to receive the input test signal at pin 223 through pass gate 216, and the inverting input terminal of JTAG hysteretic comparator 212 is coupled to receive the constant common mode reference voltage VCM through pass gate 218 and resistor 214.

The output signal BSRXP of comparator 202 toggles when its differential input voltage increases above an upper trip point or decreases below a lower trip point. The output signal BSRXN of comparator 212 toggles when its differential input voltage increases above an upper trip point or decreases below a lower trip point. In this way, JTAG comparators 202 and 212 perform DC level detection during DC JTAG operation. The only capacitive loadings between input pins 213 and 223 and comparators 202 and 212 are the capacitances of switches 206 and 216, respectively. The capacitances of switches 206 and 216 can be very small.

Buffer 120 or another buffer circuit generates the common mode reference voltage VCM for the circuitry of FIGS. 2A-2B. The buffer that generates common mode voltage VCM provides a low impedance connection (i.e., virtual ground) to termination resistors 211 and 221 that helps to isolate input pins 213 and 223 and to detect common-mode faults more easily. A network of resistors and pass gates can implement variable termination resistors 211 and 221. The resistances of resistors 211 and 221 can be varied to match the characteristic impedance of the transmission lines coupled to pins 213 and 223, respectively.

The test circuitry of FIGS. 2A-2B also includes loopback circuits. The loopback circuits include decoder 203 and pass gates 205, 209, 215, and 219. The loopback circuits of FIGS. 2A-2B in conjunction with the loopback circuits of FIGS. 1A-1B enable a self-test of the JTAG transmitter and JTAG receiver circuitry during loopback operation. The loopback circuits of FIGS. 1A-1B include decoder 104, pre-drivers 102 and 112, and logic AND gates 107 and 117. Specifically, the loopback circuits of FIGS. 1A-2B enable a self-test of JTAG hysteretic comparators 202 and 212, resistors 204 and 214, capacitors 210 and 220, pass gates 206 and 216, pass gates 207 and 217, pass gates 208 and 218, the buffer that generates VCM, and pre-drivers 102 and 112. The loopback operation permits self-tests of the JTAG transmitter and JTAG receiver circuitry to locate process and manufacturing faults as part of the overall chip testing strategy.

Decoder 203 generates a digital loopback enable signal ENLP in response to control signal JTAGLP. Loopback enable signal ENLP is transmitted to control input terminals of pass gates 205, 209, 215, and 219. In order to disable loopback operation, decoder 203 drives the ENLP signal to a logic state that puts pass gates 205, 209, 215, and 219 in non-conductive opened states.

In order to enable the loopback operation, decoder 203 drives the ENLP signal to a logic state that puts pass gates 205, 209, 215, and 219 in conductive closed states. When pass gates 205 and 209 are closed, the circuitry of FIGS. 2A-2B is in loopback operation. As mentioned above, decoder 104 drives the ENLPTX signal to a logic high state during loopback operation. In loopback operation, pre-driver circuit 102 drives boundary scan test signal BSTXP through AND gate 107 and pass gate 205 to the non-inverting input terminal of hysteretic comparator 202 as signal VLPP. Also, pre-driver circuit 112 drives boundary scan test signal BSTXN through AND gate 117 and pass gate 215 to the non-inverting input terminal of hysteretic comparator 212 as signal VLPN in loopback operation.

During loopback operation, the JTAG transmitter circuitry of FIGS. 1A-1B that transmits the BSTXP and BSTXN test signals and the JTAG receiver circuitry of FIGS. 2A-2B that receives the BSTXP and BSTXN test signals are located in the same channel on the same integrated circuit. The BSTXP and BSTXN test signals are transmitted entirely within the integrated circuit that contains the circuitry of FIGS. 1A-2B during loopback operation without being transmitted through external pins. The BSTXP and BSTXN test signals are not transmitted outside the integrated circuit that contains the circuitry of FIGS. 1A-2B during loopback operation. Providing a loopback operation that involves transmitting test signals BSTXP and BSTXN entirely on-chip eliminates the need for external components to perform a self-test of the JTAG transmitter and receiver circuitry and allows on-chip faults to be isolated. The on-chip loopback operation also reduces the test time needed to test the JTAG receiver circuitry.

Pre-driver circuit 102 varies the loopback voltage VLPP between the supply voltage VDD (i.e., a logic high state) and ground (i.e., a logic low state) during loopback operation in response to test signal BSTXP to implement a self-test of the JTAG receiver circuitry of FIG. 2A. Pre-driver circuit 112 varies the loopback voltage VLPN between the supply voltage VDD (i.e., a logic high state) and ground (i.e., a logic low state) during loopback operation in response to test signal BSTXN to implement a self-test of the JTAG receiver circuitry of FIG. 2B.

During loopback operation, pass gates 205 and 209 function as a resistor divider. Pass gates 205 and 209 have nearly the same resistance values when they are closed. As a result, hysteretic comparator 202 receives a voltage signal that is about ½ VDD at its non-inverting input terminal when the output voltage VLPP of AND gate 107 is at VDD in loopback operation. Hysteretic comparator 202 receives a voltage signal that is near ground at its non-inverting input terminal when the output voltage VLPP of AND gate 107 is at ground (e.g., 0.3 volts if VCM equals about 0.6 volts). These voltage levels are similar to the voltage levels received by comparator 202 from pin 213 in JTAG operation.

Also in loopback operation, hysteretic comparator 212 receives a voltage signal that is about ½ VDD at its non-inverting input terminal when the output voltage VLPN of AND gate 117 is at VDD. Hysteretic comparator 212 receives a voltage signal that is near ground at its non-inverting input terminal when the output voltage VLPN of AND gate 117 is at ground (e.g., 0.3 volts if VCM equals about 0.6 volts). These voltage levels are similar to the voltage levels received by comparator 212 from pin 223 in JTAG operation.

In loopback operation, hysteretic comparators 202 and 212 can function in AC loopback mode or in DC loopback mode. In DC loopback mode, pass gates 207 and 217 are opened, and pass gates 208 and 218 are closed. Hysteretic comparators 202 and 212 compare the loopback signals VLPP and VLPN to the constant common mode voltage VCM to generate output signals BSRXP and BSRXN, respectively, in DC loopback mode. Output signals BSRXP and BSRXN toggle when the differential input voltages of comparators 202 and 212 rise above or fall below the hysteretic trip points of comparators 202 and 212, respectively.

In AC loopback mode, pass gates 207 and 217 are closed, and pass gates 208 and 218 are opened. Loopback signals VLPP and VPLN are transmitted to the non-inverting input terminals of comparators 202 and 212 through pass gates 205 and 215, respectively. Hysteretic comparators 202 and 212 compare the loopback signals VLPP and VLPN to delayed versions of the loopback signals VLPP and VLPN, respectively, as received through the low pass filters at their inverting input terminals. The low pass filter formed by resistor 204 and capacitor 210 delays the loopback signal VLPP as received at the inverting input terminal of comparator 202. The low pass filter formed by resistor 214 and capacitor 220 delays the loopback signal VLPN as received at the inverting input terminal of comparator 212. The delays in the voltage transitions generated by the low pass filters cause differential voltages across the input terminals of JTAG hysteretic comparators 202 and 212. If the differential voltages across the input terminals of comparators 202 and 212 have sufficiently fast rise or fall times and sufficient amplitudes to overcome the hysteresis of the comparators, the output signals BSRXP and BSRXN change state.

Figure 3:
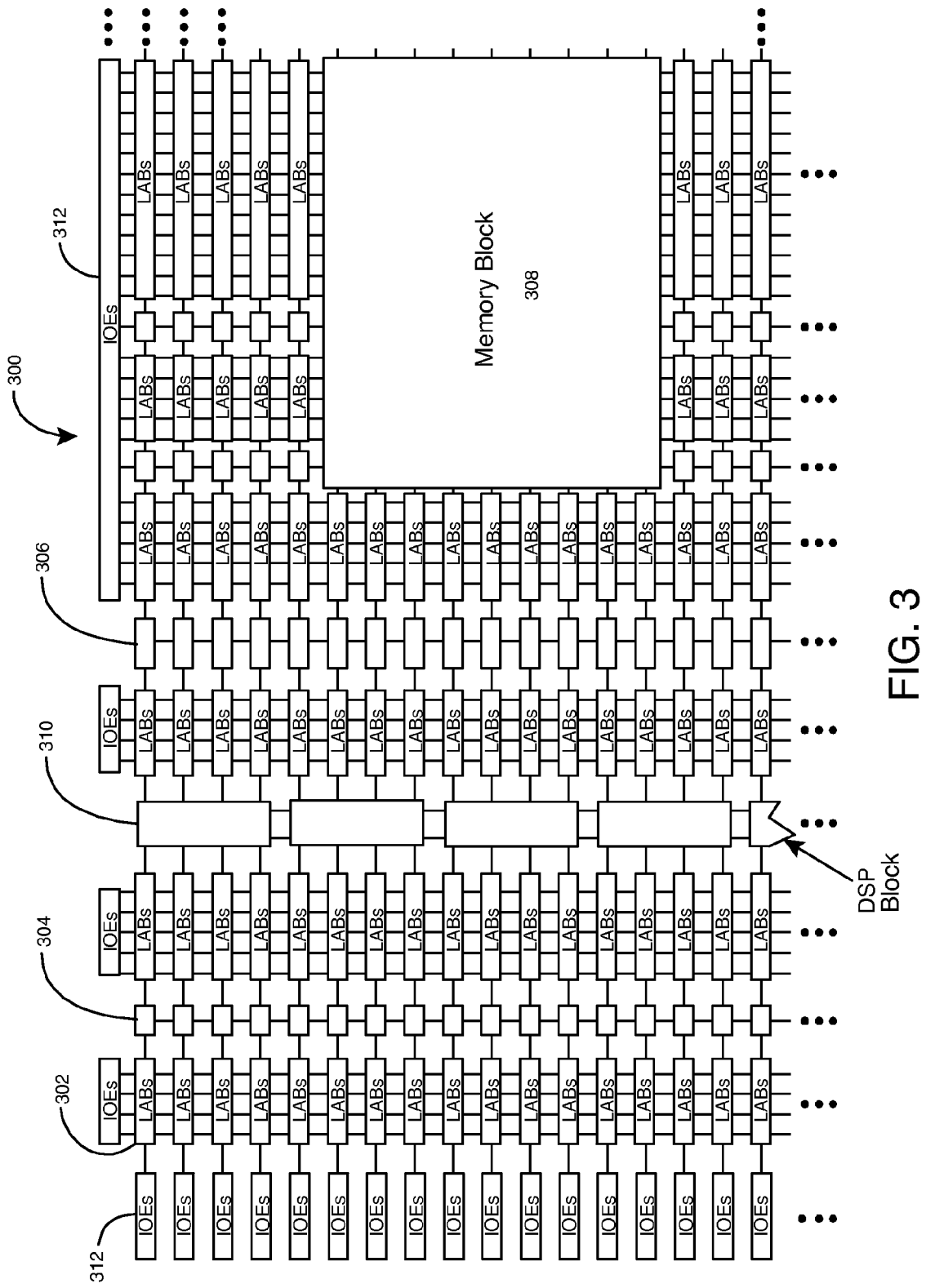
FIG. 3 is a simplified partial block diagram of a field programmable gate array (FPGA) that can include aspects of the present invention.

FIG. 3 is a simplified partial block diagram of a field programmable gate array (FPGA) 300 that can include aspects of the present invention. FPGA 300 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 300 includes a two-dimensional array of programmable logic array blocks (or LABs) 302 that are interconnected by a network of column and row interconnect conductors of varying length and speed. LABs 302 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 300 also includes a distributed memory structure including random access memory (RAM) blocks of varying sizes provided throughout the array. The RAM blocks include, for example, blocks 304, blocks 306, and block 308. These memory blocks can also include shift registers and first-in-first-out (FIFO) buffers.

FPGA 300 further includes digital signal processing (DSP) blocks 310 that can implement, for example, multipliers with add or subtract features. Input/output elements (IOEs) 312 located, in this example, around the periphery of the chip, support numerous single-ended and differential input/output standards. IOEs 312 are coupled to pins. Each of the pins is an external terminal of the FPGA. It is to be understood that FPGA 300 is described herein for illustrative purposes only and that the present invention can be implemented in many different types of PLDs, FPGAs, and ASICs.

Figure 4:
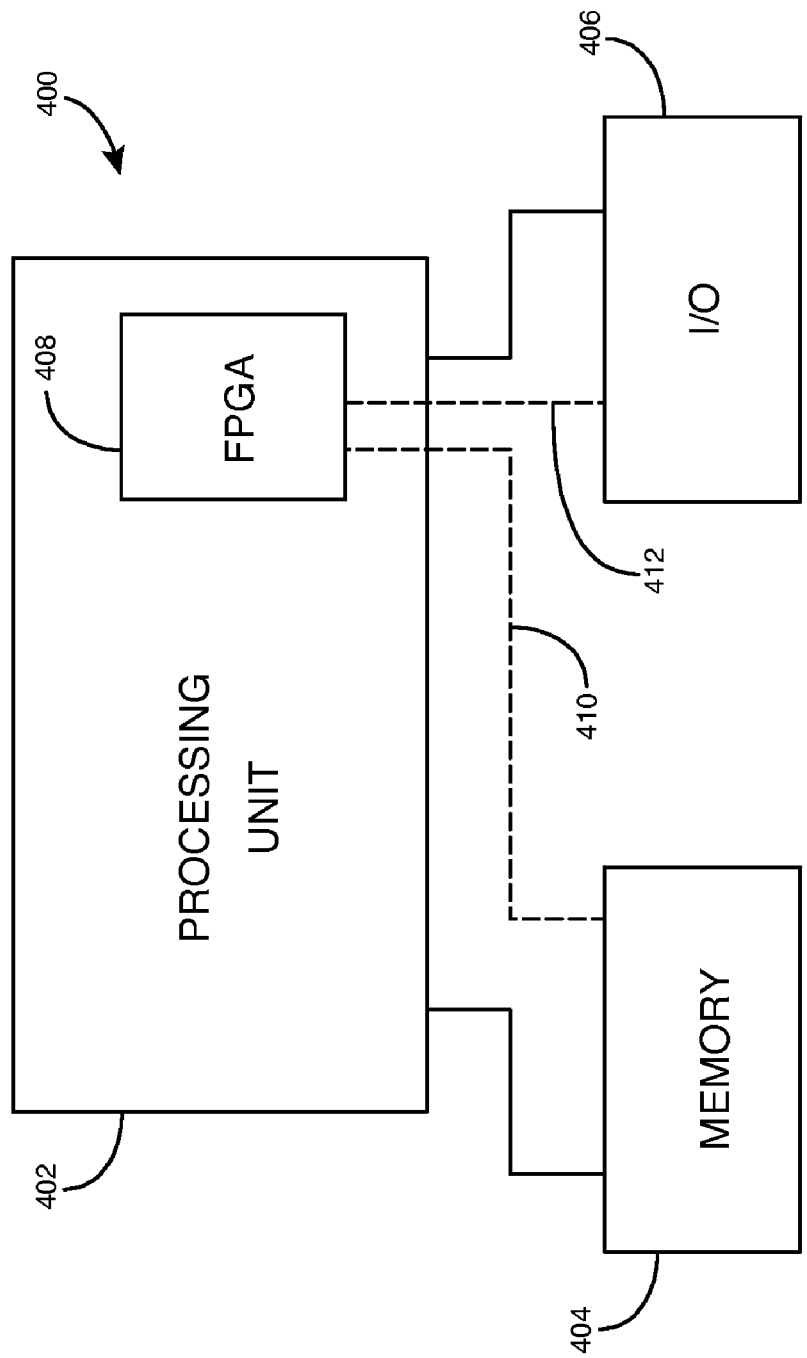
FIG. 4 shows a block diagram of an exemplary digital system that can embody techniques of the present invention.

The present invention can also be implemented in a system that has an FPGA as one of several components. FIG. 4 shows a block diagram of an exemplary digital system 400 that can embody techniques of the present invention. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404, and an input/output (I/O) unit 406 interconnected together by one or more buses. According to this exemplary embodiment, an FPGA 408 is embedded in processing unit 402. FPGA 408 can serve many different purposes within the system of FIG. 4. FPGA 408 can, for example, be a logical building block of processing unit 402, supporting its internal and external operations. FPGA 408 is programmed to implement the logical functions necessary to carry on its particular role in system operation. FPGA 408 can be specially coupled to memory 404 through connection 410 and to I/O unit 406 through connection 412.

Processing unit 402 can direct data to an appropriate system component for processing or storage, execute a program stored in memory 404, receive and transmit data via I/O unit 406, or other similar functions. Processing unit 402 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 408 can control the logical operations of the system. As another example, FPGA 408 acts as a reconfigurable processor that can be reprogrammed as needed to handle a particular computing task. Alternatively, FPGA 408 can itself include an embedded microprocessor. Memory unit 404 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A transmitter circuit comprising:
    a data driver circuit configured to drive an output data signal to a first pin during data transmission operation;
    a first test driver circuit;
    a first resistive termination circuit coupled between a first output terminal of the data driver circuit and an output terminal of the first test driver circuit,
    wherein the first test driver circuit is configured to drive a first test signal through the first resistive termination circuit to the first pin during a boundary scan test operation; and
    a first pass gate operable to couple the first resistive termination circuit to a common mode voltage source during the data transmission operation, wherein the first pass gate is operable to decouple the first resistive termination circuit from the common mode voltage source during the boundary scan test operation.

2. The transmitter circuit defined in claim 1 wherein the first resistive termination circuit has an adjustable resistance.

3. The transmitter circuit defined in claim 1 wherein the common mode voltage source comprises a buffer circuit that maintains a constant common mode voltage at an input of the first pass gate.

4. The transmitter circuit defined in claim 1 further comprising:
    a second test driver circuit; and
    a second resistive termination circuit coupled between a second output terminal of the data driver circuit and an output terminal of the second test driver circuit,
    wherein the data driver circuit is configured to drive a differential output data signal across the first pin and a second pin during the data transmission operation, and wherein the second test driver circuit is configured to drive a second test signal through the second resistive termination circuit to the second pin during the boundary scan test operation.

5. The transmitter circuit defined in claim 4 further comprising:
a second pass gate coupled between the second resistive termination circuit and the common mode voltage source,
wherein the second pass gate decouples the output terminal of the second test driver circuit from the common mode voltage source during the boundary scan test operation, and the second pass gate couples the second resistive termination circuit to the common mode voltage source during the data transmission operation.

6. The transmitter circuit defined in claim 1 further comprising:
a pre-driver circuit coupled to an input terminal of the first test driver circuit; and
a logic gate having a first input terminal coupled to an output terminal of the pre-driver circuit, a second input terminal coupled to receive a loopback enable signal, and an output terminal coupled to drive a loopback test signal to a receiver on an integrated circuit that contains the first test driver circuit.

7. The transmitter circuit defined in claim 1 wherein transmitter circuit is fabricated on a field programmable gate array integrated circuit.

8. A circuit comprising:
a data receiver circuit coupled to receive a first input data signal from a first pin during data transmission operation;
a first test receiver circuit coupled to receive a test signal from the first pin during a boundary scan test operation;
a first pass gate coupled between the first pin and a first input terminal of the first test receiver circuit; and
a second pass gate coupled between the first pass gate and a second input terminal of the first test receiver circuit,
wherein the first pass gate couples the first input terminal of the first test receiver circuit to the first pin during the boundary scan test operation, and the first pass gate decouples the first input terminal of the first test receiver circuit from the first pin during the data transmission operation.

9. The circuit defined in claim 8 further comprising:
a third pass gate coupled between the second input terminal of the first test receiver circuit and a voltage source,
wherein the second pass gate couples the first pass gate to the second input terminal of the first test receiver circuit during an AC mode of the boundary scan test operation, and wherein the third pass gate couples the second input terminal of the first test receiver circuit to the voltage source during a DC mode of the boundary scan test operation.

10. The circuit defined in claim 9 further comprising:
a termination resistor coupled between the voltage source and the first pin.

11. The circuit defined in claim 8 further comprising:
a third pass gate coupled to the first test receiver circuit, wherein the third pass gate is enabled to transmit a loopback test signal from a transmitter to the first test receiver circuit; and
a fourth pass gate coupled between the first test receiver circuit and a voltage source.

12. The circuit defined in claim 8 further comprising:
a low pass filter circuit coupled between the second pass gate and the second input terminal of the first test receiver circuit.

13. The circuit defined in claim 8 further comprising:
a second test receiver circuit coupled to receive a test signal from a second pin during the boundary scan test operation, wherein the data receiver circuit is coupled to receive a second input data signal from the second pin during the data transmission operation;
a third pass gate coupled between the second pin and a first input terminal of the second test receiver circuit; and
a fourth pass gate coupled between the third pass gate and a second input terminal of the second test receiver circuit,
wherein the third pass gate couples the first input terminal of the second test receiver circuit to the second pin during the boundary scan test operation, and the third pass gate decouples the first input terminal of the second test receiver circuit from the second pin during the data transmission operation.

14. The circuit defined in claim 13 further comprising:
a fifth pass gate coupled between the second input terminal of the second test receiver circuit and a voltage source,
wherein the fourth pass gate couples the third pass gate to the second input terminal of the second test receiver circuit during an AC mode of the boundary scan test operation, and wherein the fifth pass gate couples the second input terminal of the second test receiver circuit to the voltage source during a DC mode of the boundary scan test operation.

15. The circuit defined in claim 13 wherein the first test receiver circuit is a first hysteretic comparator circuit, and the second test receiver circuit is a second hysteretic comparator circuit.

16. An integrated circuit comprising:
a transmitter circuit coupled to a first pin;
a data receiver coupled to a second pin;
a first test receiver; and
a first loopback circuit comprising a first pass gate coupled to transmit a first test signal from the transmitter circuit to an input terminal of the first test receiver during loopback operation, and a second pass gate coupled between the input terminal of the first test receiver and a voltage source, wherein the first test signal is routed entirely through conductors and circuitry located within the integrated circuit during the loopback operation.

17. The integrated circuit defined in claim 16 further comprising:
a third pass gate coupled between the first test receiver and the second pin that is closed during boundary scan test operation.

18. The integrated circuit defined in claim 16 wherein the first loopback circuit further comprises a logic gate coupled to enable transmission of the first test signal from the transmitter circuit to the first test receiver in response to an enable signal during the loopback operation.

19. The integrated circuit defined in claim 16 further comprising:
a second test receiver; and
a second loopback circuit comprising a third pass gate coupled to transmit a second test signal from the transmitter circuit to an input terminal of the second test receiver during the loopback operation, and a fourth pass gate coupled between the input terminal of the second test receiver and the voltage source, wherein the second test signal is routed entirely through conductors and circuitry located within the integrated circuit during the loopback operation.

20. An integrated circuit comprising:
a transmitter coupled to a first pin;
a receiver coupled to a second pin;
a first pass gate coupled to the second pin;
a first comparator coupled to the first pass gate;
a second pass gate coupled to the first comparator, wherein the second pass gate is enabled to transmit a first test signal from the transmitter to an input terminal of the first comparator; and
a third pass gate coupled between the first comparator and a voltage source.

21. The integrated circuit defined in claim 20 wherein the first test signal is routed only through conductors and circuitry that are located entirely within the integrated circuit.

22. The integrated circuit defined in claim 20 further comprising:
a fourth pass gate coupled to a third pin, wherein the receiver is coupled to the third pin;
a second comparator coupled to the fourth pass gate;
a fifth pass gate coupled to the second comparator, wherein the fifth pass gate is enabled to transmit a second test signal from the transmitter to an input terminal of the second comparator; and
a sixth pass gate coupled between the second comparator and the voltage source.

23. The integrated circuit defined in claim 20 wherein the second and the third pass gates are in conductive closed states during a loopback operation, and wherein the first test signal is routed entirely through conductors and circuitry located within the integrated circuit during the loopback operation.

24. A method comprising:
coupling an output of a test driver to a voltage source during a data transmission operation using a pass gate;
decoupling the output of the test driver from the voltage source during a boundary scan test operation using the pass gate;
generating a first test signal using a pre-driver circuit;
generating a second test signal based on the first test signal using the test driver during the boundary scan test operation, wherein the second test signal is provided to a pin; and
providing a third test signal to an input of a test receiver through a loopback circuit during a loopback operation, wherein the third test signal is generated based on the first test signal, and wherein the pre-driver circuit, the test driver, the test receiver, and the loopback circuit are in an integrated circuit.

* * * * *